US005511015A

United States Patent [19]

Flockencier

[11] Patent Number: 5,511,015

[45] Date of Patent: Apr. 23, 1996

[54] DOUBLE-ACCUMULATOR IMPLEMENTATION OF THE CONVOLUTION FUNCTION

[75] Inventor: Stuart W. Flockencier, Cedar Hill, Tex.

[73] Assignee: Loral Vought Systems Corporation, Grand Prairie, Tex.

[21] Appl. No.: 158,757

[22] Filed: Nov. 30, 1993

[51] Int. Cl.[6] .............................. G06F 17/15; G06F 17/10

[52] U.S. Cl. .............................. 364/728.01; 364/726.12

[58] Field of Search .............................. 364/728.01, 728.02, 364/728.03, 728.07, 735, 729, 604, 819

[56] References Cited

U.S. PATENT DOCUMENTS

| | | | |
|---|---|---|---|
| 4,727,505 | 2/1988 | Konishi et al. | 364/728.01 |
| 4,907,182 | 3/1990 | Giuliano et al. | 364/728.01 |

FOREIGN PATENT DOCUMENTS

| | | |
|---|---|---|
| 1571702 | 7/1980 | United Kingdom . |

OTHER PUBLICATIONS

Image Processing Databook, 2nd Edition, SGS–Thomson Microelectronics, Oct., 1992, pp. 175–277.

Harris, HSP43891 Digital Filter [Information Sheet] 1992.

*Primary Examiner*—Paul P. Gordon
*Assistant Examiner*—Emmanuel L. Moise
*Attorney, Agent, or Firm*—Arnold, White & Durkee

[57] ABSTRACT

A Finite Impulse Response (FIR) digital signal processing circuit uses a double-accumulator technique to drastically reduce the number of multiply-accumulate operations which are necessary per sample of input data. The amount of reduction is dependent upon the shape of the filter function to be convolved. A double-accumulator (D-A) can be implemented by first providing a set of D-A coefficients, which are derived from the filter coefficient stream (FCS). Each D-A coefficient is multiplied by a separate input data sample. The products are summed together along with the result of a previous multiplication of the same D-A coefficients with different input data samples. This first sum is added to another number to form a second sum. The other number is the previous value of the second sum. The second sum is the result.

The derived D-A coefficients are fewer and simpler than that required by the conventional FIR implementation. Since multipliers are complex, costly, bulky and limited in speed, the D-A method can lessen these constraints.

9 Claims, 11 Drawing Sheets

| n | $Z_n$ |
|---|---|
| -1 | 0 |
| 0 | $A_0$ |
| 1 | $2A_0+A_1$ |
| 2 | $3A_0+2A_1+A_2$ |
| 3 | $2A_0+3A_1+2A_2+A_3$ |
| 4 | $A_0+2A_1+3A_2+2A_3+A_4$ |
| 5 | $A_1+2A_2+3A_3+2A_4+A_5$ |
| 6 | $A_2+2A_3+3A_4+2A_5+A_6$ |
| ⋮ | ⋮ |
Fig. 6b
*(PRIOR ART)*
Fig. 6c
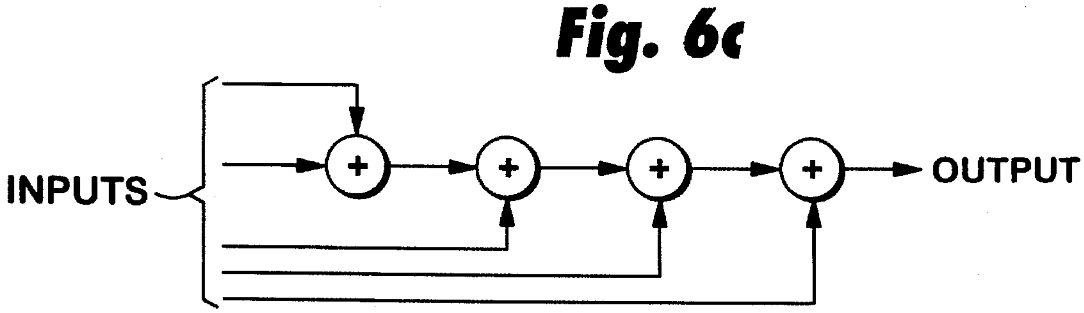
Fig. 8
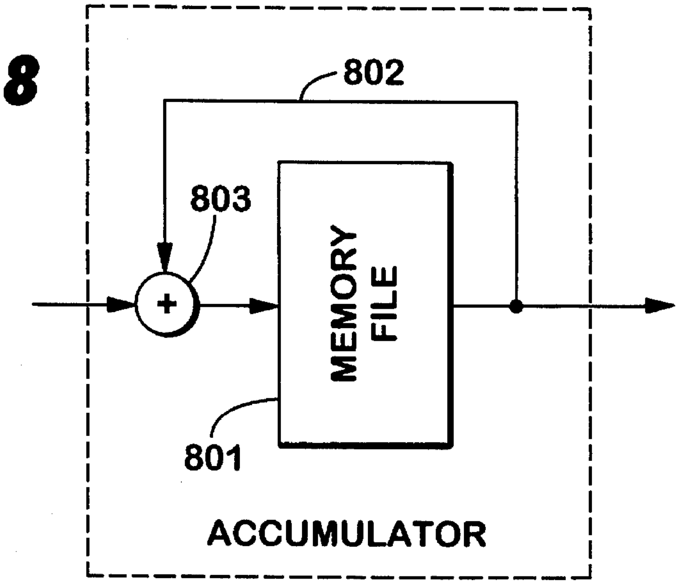

Fig. 11b

| n | $B_n$ | $C_n = \Sigma B_n$ | $Z_n = \Sigma C_n$ | |
|---|---|---|---|---|
| -1 | 0 | 0 | 0 | 1101 |
| 0 | $A_0$ | $A_0$ | $A_0$ | 1102 |
| 1 | $A_1$ | $A_0+A_1$ | $2A_0+A_1$ | 1103 |
| 2 | $A_2$ | $A_0+A_1+A_2$ | $3A_0+2A_1+A_2$ | 1104 |
| 3 | $A_3-2A_0$ | $-A_0+A_1+A_2+A_3$ | $2A_0+3A_1+2A_2+A_3$ | 1105 |
| 4 | $A_4-2A_1$ | $-A_0-A_1+A_2+A_3+A_4$ | $A_0+2A_1+3A_2+2A_3+A_4$ | 1106 |
| 5 | $A_5-2A_2$ | $-A_0-A_1-A_2+A_3+A_4+A_5$ | $A_1+2A_2+3A_3+2A_4+A_5$ | 1107 |
| 6 | $A_6-2A_3+A_0$ | $-A_1-A_2-A_3+A_4+A_5+A_6$ | $A_2+2A_3+3A_4+2A_5+A_6$ | 1108 |
| 7 | $A_7-2A_4+A_1$ | $-A_2-A_3-A_4+A_5+A_6+A_7$ | $A_3+2A_4+3A_5+2A_6+A_7$ | 1109 |
| 8 | $A_8-2A_5+A_2$ | $-A_3-A_4-A_5+A_6+A_7+A_8$ | $A_4+2A_5+3A_6+2A_7+A_8$ | 1110 |
| 9 | $A_9-2A_6+A_3$ | $-A_4-A_5-A_6+A_7+A_8+A_9$ | $A_5+2A_6+3A_7+2A_8+A_9$ | 1111 |
| ⋮ | ⋮ | ⋮ | ⋮ | |

DOUBLE-ACCUMULATOR IMPLEMENTATION OF THE CONVOLUTION FUNCTION

FIELD OF THE INVENTION

The present invention relates generally to digital signal processing and, more specifically, to high-speed digital signal processing circuits and methods involving convolutional or correlational coding.

BACKGROUND OF THE INVENTION

Digital signal processing (DSP) techniques are commonly used to manipulate and translate a wide variety of input signals from one form to another. Typically, analog signals such as audio are converted to digital signal form and operated on, or "processed," using digital circuitry. Because the signals are in digital signal form, they are virtually immune from numerous signal degradation problems inherent with analog signal processing. These problems include, for example, voltage and temperature drift in the host circuitry, component tolerance and aging, and EMI-induced power supply noise.

A significant part of many DSP applications includes using DSP techniques to filter signals. Digital filters allow for very precise signal processing because digital filters provide sharp cutoff characteristics, exact linear phase responses and even arbitrary phase responses.

One type of digital filter, known as the Finite Impulse Response (FIR) filter, is used for signal correlation and signal convolution in a wide variety of applications, including for example high-frequency radio communication and RADAR signal processing.

The FIR filter is a discrete linear time-invariant system having an output that is based on the weighted summation of a finite number of past inputs.

Correlation is a technique that is widely used in electronic systems to indicate the similarity or dissimilarity between two signals (also referred to as functions or waveforms). Such a correlation is obtained by shifting one of the waveforms by an amount of time equal to $\tau$, and then multiplying the shifted waveform with the other waveform and integrating the product. As a result: two identical signals will have a maximum positive correlation; a signal will have a maximum negative correlation with its polar opposite (the same signal rotated 180 degrees about the X axis); and a signal will have a zero or negligible correlation with a totally dissimilar function, for example, a function correlated with a noise signal. Correlation is advantageous because it exhibits many useful signal characteristics, such as the ability to recover a signal from noise, the ability to estimate delay, the ability to characterize signals.

Convolution is a mathematical process that is closely related to the correlation process and is also used in DSP filtering. In convolution, however, one signal is time reversed (shifted about the Y axis or where time equals 0) before being shifted by $\tau$. The convolution process occurs in filters where the output of a filter, f(t), is the convolution of the input function, d(t), with the impulse response of the filter, h(t). In discrete time, the convolution of two signals x(t) and y(t) is defined by Equation 1, as follows:

$$Cxy(m) = \frac{1}{N} \sum_{K=0}^{N-1} x(k)y(m-k)$$

As reflected in Equation 1, convolution (like correlation) requires N multiply-and-accumulate operations for each sample of Cxy(m), where N is the number of convolution points having a size dependent upon the duration of the two functions or their periodicity if they are periodic. The parameters "k" and "m" are used to index the sample points of the respective input signals.

The convolution procedure requires operation upon two functions. In the field of signal filtering, one function is that of the (usually fixed) filter function. The other function is the variable input data or samples. Since the invention takes place in the digital domain, both functions are expressed as a stream of whole numbers. Each number is the "value" of the represented function at a discrete point. Therefore, each function may be expressed as a stream or sequence of values in time.

For real time applications in which signals are processed as they are received, data processing must occur very quickly. More specifically, the DSP system must perform the necessary calculations fast enough to accommodate the Nyquist rate (over two times the bandwidth of the sampled signal). As stated above, each sample Cxy(m) requires N multiply-and-accumulate operations. This is because the summation must be calculated for every value of k, from (k=0) through (k=(N–1)).

In a system designed to process signals having frequencies up to 50 MHz, for example, the sampling rate (Nyquist rate) must be at least 100 MHz (100 mega-samples/second) which corresponds to a period of ten nanoseconds. This means that the system has ten nanoseconds to accomplish N multiply-and-accumulate operations. If N is equal to ten (meaning that the filter function is ten samples wide) then each of the ten multiply-and-accumulate operations must be accomplished in one nanosecond. This would be a formidable task for even modern day electronics.

In known DSP implementations, this processing-speed problem is addressed by performing all calculations in parallel. In hardware, this task is accomplished by simultaneously using N multipliers (one for each multiply operation dictated by Equation 1) and summing the N results. Applying this solution to the example above, this arrangement would provide ten nanoseconds, rather than one nanosecond, to perform each of the ten multiply-and-accumulate operations. This solution, however, is often undesirable because of cost, power or space restrictions on the host system.

As semiconductor technology has progressed, these restrictions have been partly mitigated by increasing the circuit integration density on a single chip and using more advanced semiconductor technology requiring less power. For example, a device like SGS-Thomson's IMS A100 incorporates thirty-two multiply-adders with an input data rate of 5 MHz at 8 bits. Unfortunately, circuits such as this are expensive and limited in speed. For video applications a faster device is required such as the cascadable Harris HSP43891 which has eight multiply-summers, and has a maximum input data rate of 30 MHz. Most real-world applications require tens of multipliers per input sample and thus would require several of these expensive devices. While 30 MHz is a sufficient rate for video, RADAR and LADAR operate in the 100–1000 MHz range. Off-the-shelf convolvers operating at these data rates are not yet available and will be very expensive and bulky. A monolithic custom device using conventional circuit implementations could be built but would be limited in the number of multipliers. Thus a simpler solution is needed for both the cost-conscious commercial world and for high-speed military needs.

A conventional approach to real-time digital convolution, using an sample function with non-specific input data, is exemplified by way of FIGS. 1*a*, 5, 6*a* and 6*b*. FIG. 1*a* is a graph of a filter coefficient stream ("FCS"). The non-specific input data is represented by the notation $A_1$, where "t" shows the relative position of the input data points, as a sample in the time domain. Using Equation 1, the convolution of this sample function is illustrated in FIG. 5 for times ($t_{-1}$, $t_0$, $t_1$, . . . $t_6$) for each of "n" samples.

FIG. 6(*a*) shows the conventional high-speed circuit approach for implementing this convolution, using five multipliers arranged in parallel with a summation circuit 601 providing the convolution results, depicted as ($Z_n$). In practice, the summation circuit 601 is implemented by several 2-input adders as shown in FIG. 6(*c*). Specifically a total of N–1 adders are required for the conventional implementation. The table shown in 6(*b*) illustrates the summation outputs as each of the samples is processed from the lowest-positioned of the multipliers to the highest-positioned of the multipliers, and assuming that $A_0$ is the first data sample having a non-zero value.

Accordingly, for the conventional convolution implementation shown in FIGS. 6(*a*), (*b*) and (*c*), four adders and five multiply operations are required for each output value of "n". Larger and more complex functions require even more multipliers and adders, and the corresponding complexity required for these operations renders a system design which is costly in terms of both power and circuit real estate.

There is therefore a need for digital signal processing approach, useful for correlation and convolution, which overcomes the above-mentioned shortcomings.

SUMMARY OF THE INVENTION

The present invention provides a novel approach to high-speed digital processing involving correlation or convolution operations.

More specifically, the present invention provides a digital signal processing circuit implementation using a double-accumulator technique to overcome the above-stated problems by drastically reducing the number and complexity of multiply-and-add operations which have been typically necessary per sample of input data. The amount of reduction is dependent upon the shape of the filter function, i.e., the numerical relationship between adjacent filter samples. These samples are often referred to as terms or coefficients.

If the filter function is expressed as a series of "piece-wise linear" segments, then the double-accumulator technique, implemented according to the principles of the present invention, dramatically reduces the number of necessary multiply-and-add operations.[1]

[1] A sequence of filter terms are said to be piece-wise linear if each successive term represents a constant change in value from the previous term.

In an exemplary implementation, the present invention provides a circuit for convolving or correlating two input functions. The circuit includes a plurality of multipliers and first and second accumulators. Each of the multipliers has an input and an output and each is configured to multiply an input data sample by a derived D-A (double-accumulator) coefficient. The first accumulator receives the outputs of the multipliers. The second accumulator receives an output from the first accumulator.

In a more specific implementation, the above-described circuit further includes a shift register for sequentially receiving input data samples and for providing the input data samples to the inputs of the multipliers.

In yet another implementation, the present invention provides a method of correlating or convolving two functions using a first memory and a second memory. The method comprises the steps of: (i) multiplying a number of input data samples by an equal number of D-A coefficients to produce a number of products; (ii) storing in the first memory the sum of the number of products and the output of the first memory; and (iii) storing in the second memory the sum of the output of the first memory and the output of the second memory.

Preferably, a double-accumulator is implemented using a set of D-A coefficients, which are derived from the input filter coefficient stream (FCS). In most implementations, the D-A coefficients are obtained by taking the second derivative of the FCS. The second derivative operation, on the piece-wise linear coefficient stream, forces most of the D-A coefficients to zero. The remaining non-zero terms are "small" numbers compared to the original coefficients. Once ascertained, the non-zero D-A coefficients are used to weight the input data samples.

The weighting technique can be accomplished by multiplying each D-A coefficient by a separate input data sample. The products are then summed together along with the result of a previous multiplication of the same D-A coefficients with different input data samples. This first sum is added to another number to form a second sum. The other number is the previous value of the second sum. The second sum is the result. The resultant output data stream is exactly the same as the conventional method would compute.

Such a double-accumulator can be implemented in a variety of circuits. For example, a register-based double accumulator may be implemented using a shift register to sequentially move input data across the inputs to a plurality of multipliers. The multipliers are used to multiply the input data by selected D-A coefficients. The products are summed together and provided to a first accumulator. The first accumulator provides its output to the input of a second accumulator. The second accumulator provides the result.

The double accumulator may also be configured using a RAM-based convolver or correlator. In this case, memory is used to hold data samples and D-A coefficients. An address generator directs the memory to provide appropriate pairs of input data samples and D-A coefficients. These pairs are provided to a multiply-accumulator. The output of the multiply-accumulator is coupled to a conventional accumulator. The output of the conventional accumulator is the result.

The above summary of the present invention is not intended to represent each embodiment, or every aspect, of the present invention. This is the purpose of the figures and the detailed description which follow.

BRIEF DESCRIPTION OF THE DRAWINGS

Other aspects, objects and advantages of the present invention will become apparent upon reading the following detailed description and upon reference to the drawings in which:

FIGS. 6*a* and 6*b* comprise a block diagram and an input/output table, respectively, which illustrate a conventional high-speed circuit approach for convoluting the input signal of FIG. 1;

FIG. 6(*c*) shows 2-input adders.

FIG. 8 is a circuit diagram illustrating an implementation of one of the accumulators shown in FIG. 3;

FIG. 11*b* is a table illustrating the results of using the D-A circuit of FIG. 10;

While the invention is susceptible to various modifications and alternative forms, specific embodiments thereof have been exemplified by way of the drawings and will be described in detail. It should be understood, however, that it is not intended to limit the invention to the particular form described. On the contrary, the intention is to cover all modifications, equivalents and alternatives falling within the spirit and scope of the invention as defined by the appended claims.

DETAILED DESCRIPTION OF THE INVENTION

Due to the wide variety of DSP applications in which the present invention may be used, there are many forms of, and names for, an input to a DSP arrangement. For the sake of both brevity and consistency, the two inputs involved in convolution (and correlation) are referred to herein as "functions", for example, the filter function and the sample or input data function. With respect to the exemplary implementations used to illustrate the principles of the present invention, the more specific terms filter coefficient stream (FCS) and input data or sample stream are also used.

A certain class of filters may be used for implementing a double-accumulator (D-A) circuitry in accordance with the present invention. These filters are those having filter coefficient streams that can be expressed as a series of piece-wise linear segments. Virtually any function may be approximated by a series of piece-wise linear segments, and the more line segments used, the more accurate the approximation, regardless of the shape of a function. Therefore, while only certain filters may be directly implemented in D-A circuitry, through approximation techniques, D-A circuitry can implement a wide range of filters.

A D-A convolver circuit is constructed using coefficients that are derived from the filter coefficient stream (FCS). These coefficients are referred to as "D-A coefficients. Referring to FIG. 1(*a*), an example of a FCS is shown plotted on a graph as the numerical series 1,2,3,2,1 formed from two piece-wise linear segments. This short series is chosen to keep the example simple and should not be viewed as a limit on the D-A method. Note that a similar sequence 1,2,3,4,5, . . . , 5,4,3,2,1 is also formed from two piece-wise linear segments and will yield the same number of non-zero D-A coefficients (three) regardless of the number of original terms. The conventional approach would contain one multiplier-summer per each original term, not three as in the D-A method.

The D-A coefficients are preferably ascertained from the second derivative of the FCS. Referring to FIG. 1(*b*), the graph shows the first derivative of the FCS in FIG. 1(*a*). Generally, the first derivative is found by Equation 2:

$$X'n = \frac{\Delta xn}{\Delta t} = \frac{Xn - Xn+1}{1}$$

FIG. 1(*c*) shows the second derivative of the FCS. Generally, the second derivative can be found by equation (3):

$$X''n = \frac{\Delta x'}{\Delta t} = \frac{X'n - X'n+1}{1}$$

Figure 2:
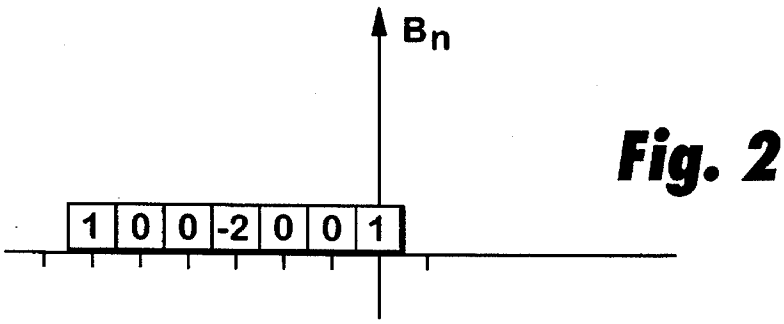
FIG. 2 is illustrates a set of D-A coefficients, obtained in accordance with the present invention by taking the second derivative of the filter coefficient stream of FIG 1*a*, against the axis "$B_n$"

The resulting values are the D-A coefficients. FIG. 2 shows the resulting D-A coefficients against the axis $B_n$. In the D-A circuitry, the input sample stream will be weighted, preferably multiplied, by these coefficients. Since most of the coefficients are zeros, the D-A circuitry requires only a few multipliers.

D-A coefficients are readily ascertained from most any function expressed as a series of line segments. One D-A coefficient is designated for each point where two line segments meet. The value of a D-A coefficient is equal to the change in slope (second derivative) from the first line segment to the second. Examples of this method are shown in FIGS. 7(*a*)–7(*c*).

Figure 7A:
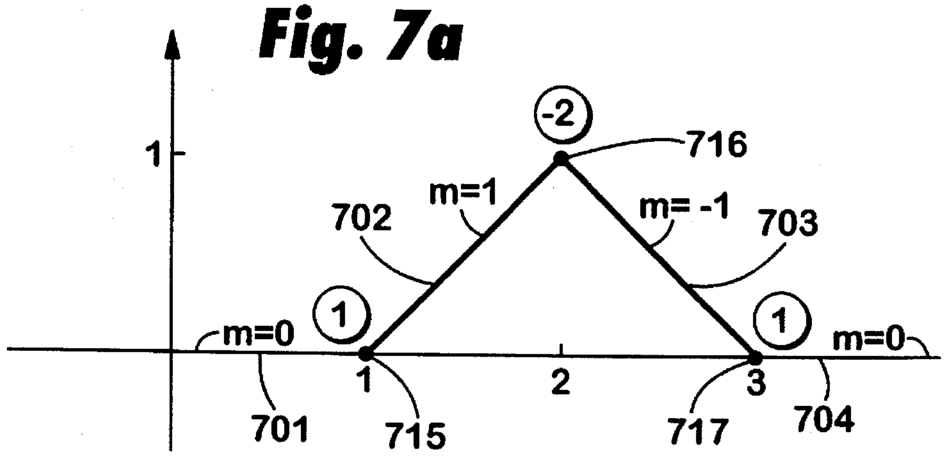
FIGS. 7*a*, 7*b* and 7*c* illustrate a series of line segments representing examples of input function from which the D-A coefficients are ascertained for use in connection with the present invention.
Figure 7B:
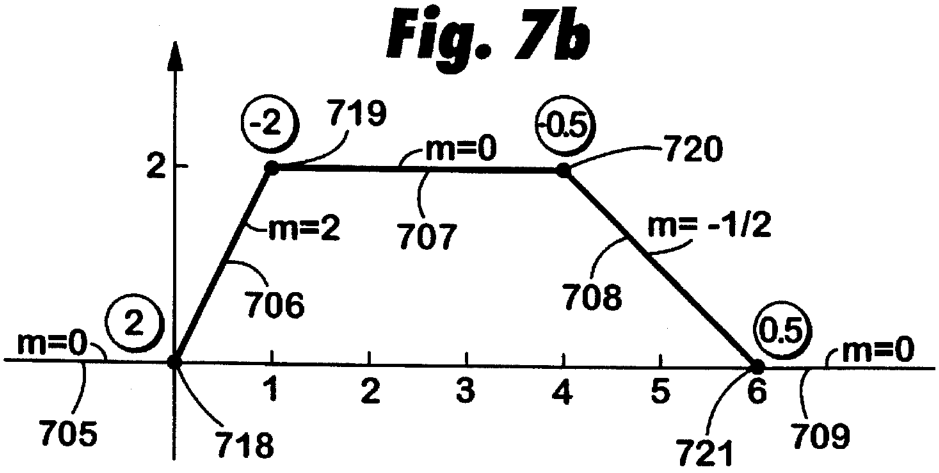
Figure 7C:
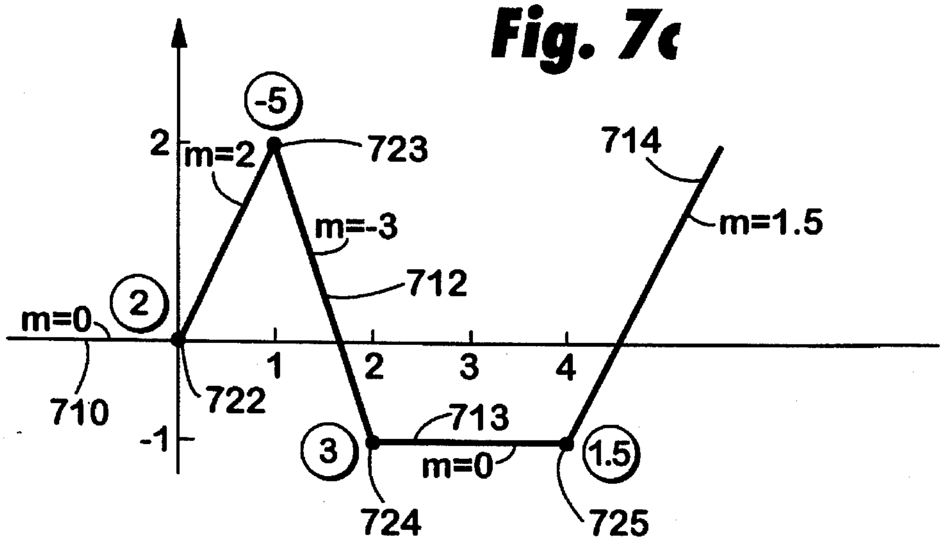

Referring first to FIG. 7(*a*), all line segment slopes are indicated by "m=" and all D-A coefficients are circled. Specifically, FIG. 7(*a*) shows line segment 701 with slope m=0 adjoining to line segment 702 having slope m=1. Therefore, the D-A coefficient at point 715 is "1" (1–0). FIG. 7(*a*) also shows line segment 702 with slope m=1 adjoining to line segment 703 having slope m=–1. Therefore, the D-A coefficient at point 716 is "–2" ((–1)–1). In addition, FIG. 7(*a*) shows line segment 703 with slope m=–1 adjoining to line segment 704 having slope m=0. Therefore, the D-A coefficient at point 717 is "1" (0-(–1)).

FIG. 7(*b*) shows line segment 705 with slope m=0 adjoining to line segment 706 having slope m=2. Therefore, the D-A coefficient at point 718 is "2" (2–0). FIG. 7(*b*) also shows line segment 706 with slope m=2 adjoining to line segment 707 having slope m=0. Therefore, the D-A coefficient at point 719 is "–2" (0–2). In addition, FIG. 7(*b*) shows line segment 707 with slope m=0 adjoining to line segment 708 having slope m=(–0.5). Therefore, the D-A coefficient at point 720 is "–0.5" ((–0.5)–0). FIG. 7(*b*) shows line segment 708 with slope m=(−0.5) adjoining to line segment 709 having slope m=0. Therefore, the D-A coefficient at point 721 is "0.5" (0-(−0.5)).

FIG. 7(*c*) shows line segment 710 with slope m=0 adjoining to line segment 711 having slope m=2. Therefore, the D-A coefficient at point 718 is "2" (2–0). FIG. 7(*c*) also shows line segment 711 with slope m=2 adjoining to line segment 712 having slope m=(−3). Therefore, the D-A coefficient at point 723 is "−5" ((−3)−2). In addition, FIG. 7(*c*) shows line segment 712 with slope m=(−3) adjoining to line segment 713 having slope m=0. Therefore, the D-A coefficient at point 724 is "3" (0-(−3)). Lastly, FIG. 7(*c*) shows line segment 713 with slope m=(0) adjoining to line segment 714 having slope m=1.5. Therefore, the D-A coefficient at point 725 is "1.5" (1.5–0).

Figure 3:
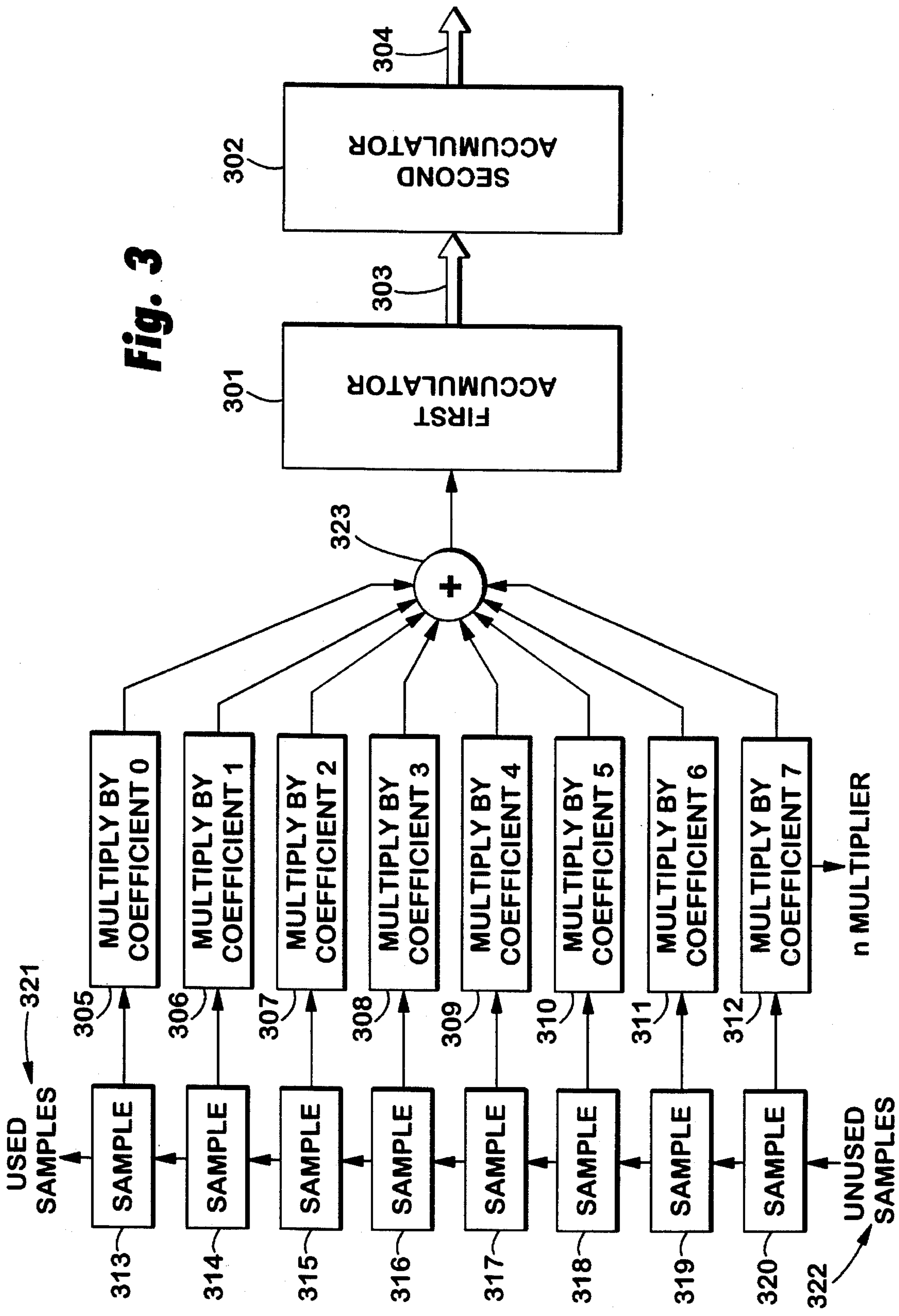
FIG. 3 is a block diagram of a D-A convolver circuit, according to the present invention.

A block representation of the D-A convolver implementation is shown in FIG. 3. Multipliers 305 through 312 are used to multiply input sample values by the ascertained D-A coefficient values. Depending upon the FCS, more or less multipliers may be used. The products from the multipliers 305–312 are added together by adder 323. The sum is fed to the first accumulator 301, which accumulates a running summation of sequential outputs from the adder 323 as each sample is processed. The result 303 from the first accumulator 301 is fed to the second accumulator 302, which accumulates a running summation of sequential outputs from the accumulator 301 as each sample is processed. The result from the second accumulator 302 is the result of the convolution (or the filtered signal value) 304.

Figure 4:
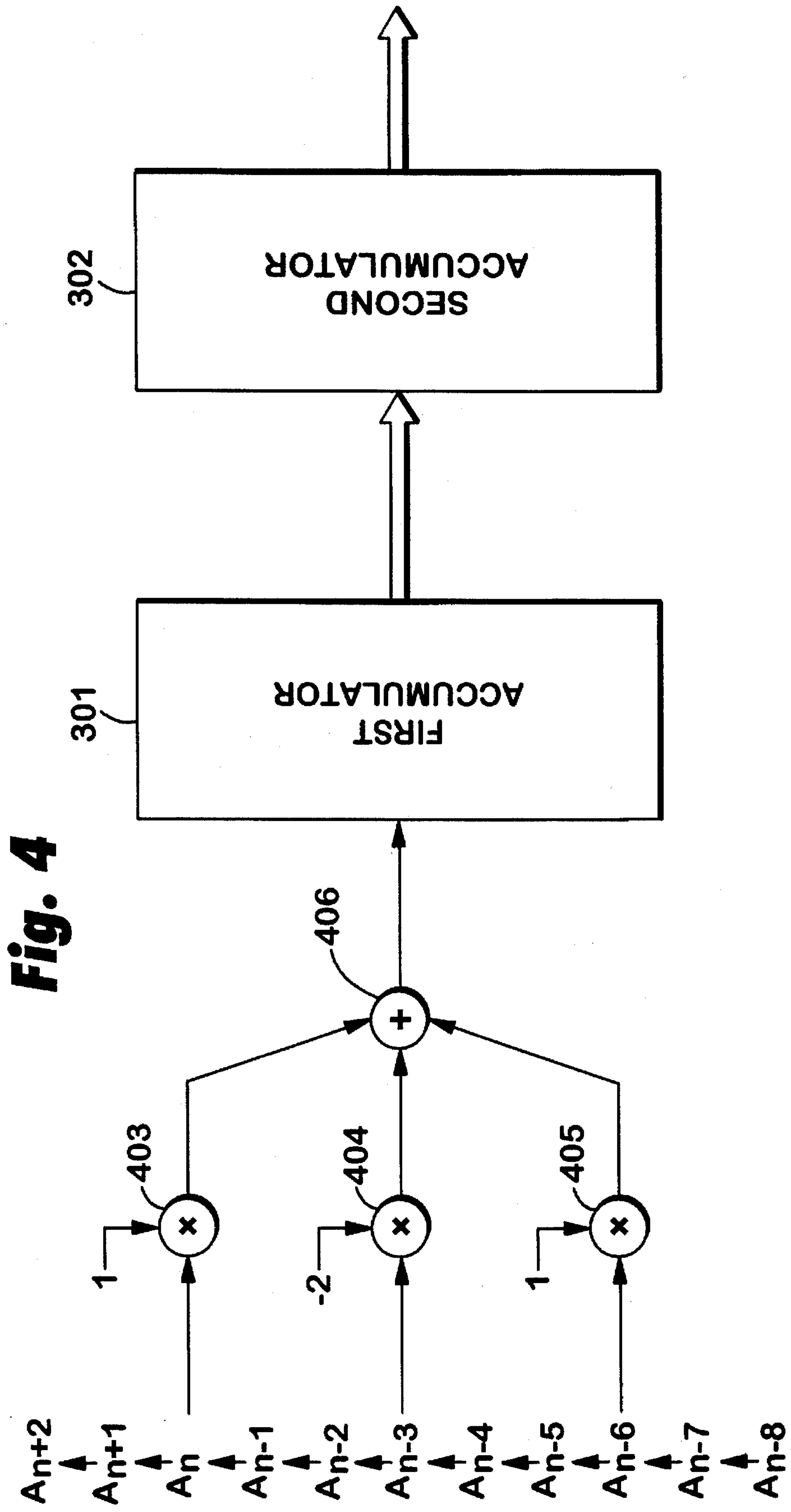
FIG. 4 is a block diagram of a simplified D-A convolver circuit after elimination of the "zero" terms, also according to the present invention, and tailored for the FCS of FIGS. 1*a* and 2.
Figure 5:
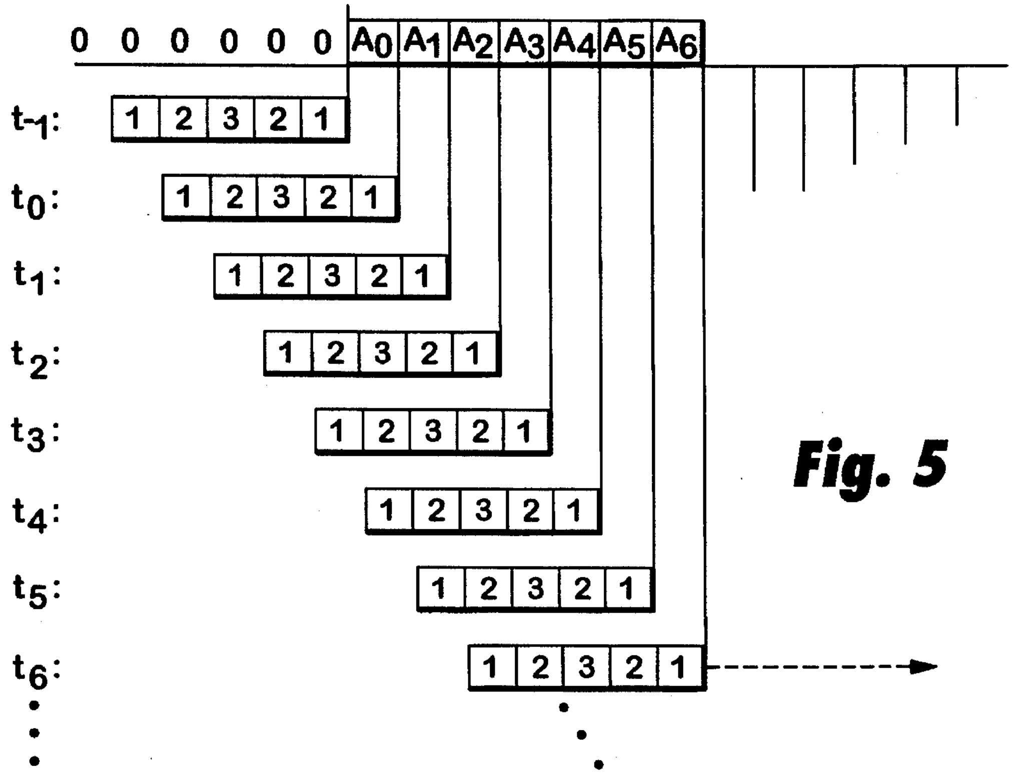
FIG. 5 is a table illustrating the convolution of the sample function of FIG. 1*a* for times ($t_{-1}$, $t_0$, $t_1$, . . . $t_6$) and for each of "n" samples.

Using the example from FIGS. 1 and 2 (discussed above), the circuitry would require only 3 multipliers. This is because 5 of the D-A coefficients are zeros (see FIG. 2). FIG. 4 shows a circuit implementation more tailored to the example of FIGS. 1 and 2. Referring to FIG. 4, the input values (samples) are designated by $A_{n-1}$. These samples are multiplied by D-A coefficients in multipliers 403,404, and 405. The multipliers 403–405 feed a summer 406 which sums the three products. The summer feeds the first accumulator 301. The first accumulator 301 feeds the second accumulator 302. The second accumulator 302 yields the result of the convolution (or a filtered signal). The first accumulator 301 and the second accumulator 302 operate in the same manner as described in connection with the accumulator 301 and 302 of FIG. 3.

Referring now to FIG. 4, the input values (samples, $A_{n-1}$) are weighted (multiplied) by the non-zero D-A coefficients from FIG. 2. Specifically, sample $A_{n-6}$ represents the most-recently input data sample and is fed into a multiplier 403 to be multiplied by the D-A coefficient "1", which corresponds to the right most D-A coefficient "1" in FIG. 2. $A_{n-3}$ is a sample taken three samples before $A_{n-6}$. $A_{n-3}$ is fed into multiplier 404 to be multiplied by the D-A coefficient "−2"; this "−2" corresponds to the "−2" D-A coefficient from FIG. 2. $A_n$ is a sample taken 6 samples before sample $A_{n-6}$. $A_n$ is fed into multiplier 405 to be multiplied by the D-A coefficient "1"; this "1" corresponds to the left most D-A coefficient in FIG. 2. The two sample spaces between $A_n$ and $A_{n-3}$ correspond to the two "0" spaces between D-A coefficients "1" and "−2" in FIG. 2. Similarly, the two sample spaces between $A_{n-3}$ and $A_{n-6}$ correspond to the two "0" spaces between D-A coefficients "−2" and "1" in FIG. 2.

FIG. 8 shows the circuitry comprising an accumulator (e.g., 301 or 302 of FIG. 4). The input to the accumulator enters a summer 803. The output of the summer 803 is stored in a memory file 801. The memory file 801 may comprise nearly any re-writable memory mechanism such as a DRAM, a register file, flip-flops, latches, etc. The output of the memory file 801 provides the second input to the summer 803 via line 802 and provides the output of the accumulator.

Figure 1A:
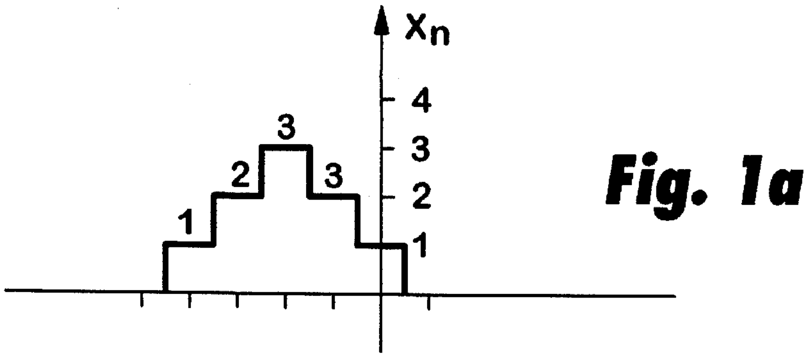
FIG. 1*a* is a graph of a filter coefficient stream ("FCS") representing an example of an input signal for both a prior art circuit implementation and a circuit implementation in accordance with the principles of the present invention.
Figure 1B:
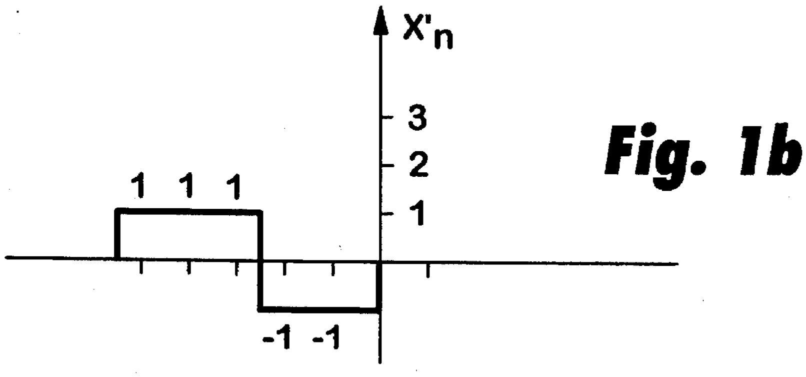
FIGS. 1*b* and 1*c* are graphs illustrating the respective first and second derivatives of the FCS represented by FIG. 1*a* and used in accordance with the principles of the present invention.
Figure 1C:
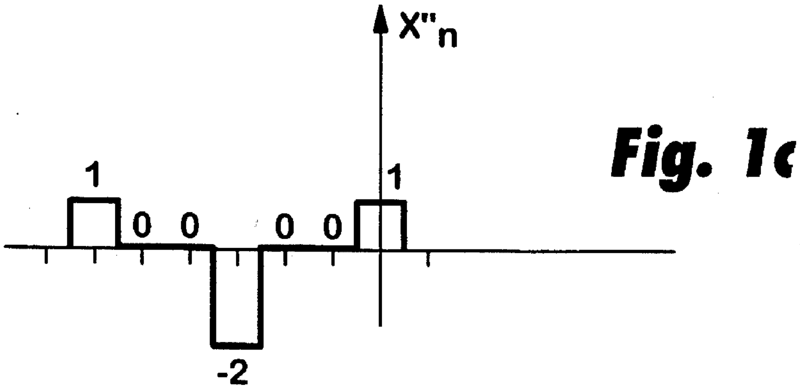
Figure 9:
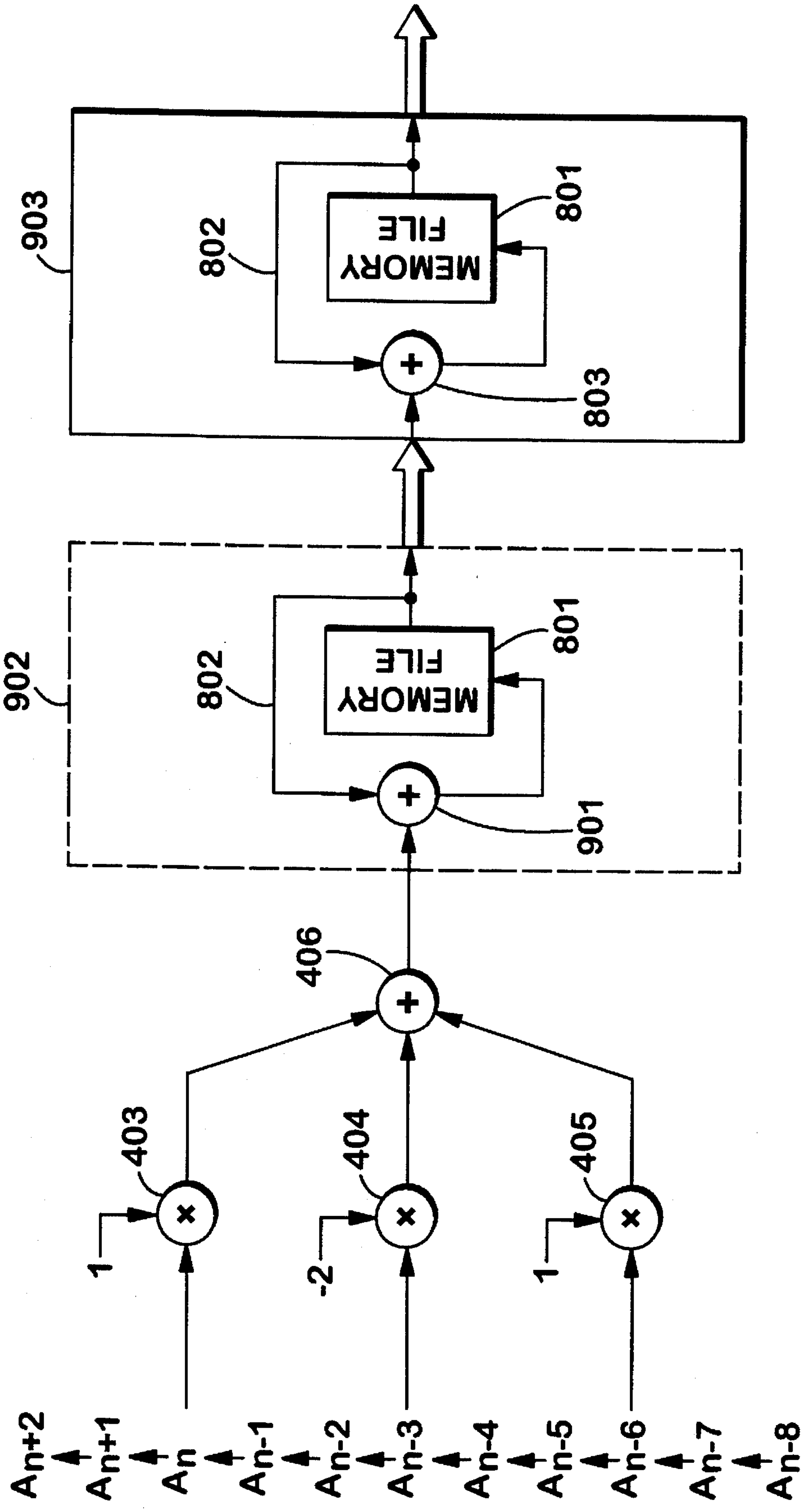
FIG. 9 is a diagram, according to the present invention, illustrating a D-A circuit implementation tailored for the FCS of FIGS. 1*a* and 2.

FIG. 9 shows a D-A circuit tailored to the example of FIGS. 1*a* and 2, including detailed diagrams of the accumulators 902 and 903, which are identical to the accumulator of FIG. 8. Alternatively, the summers 901 and 406 may be consolidated as shown in FIG. 10.

Figure 10:
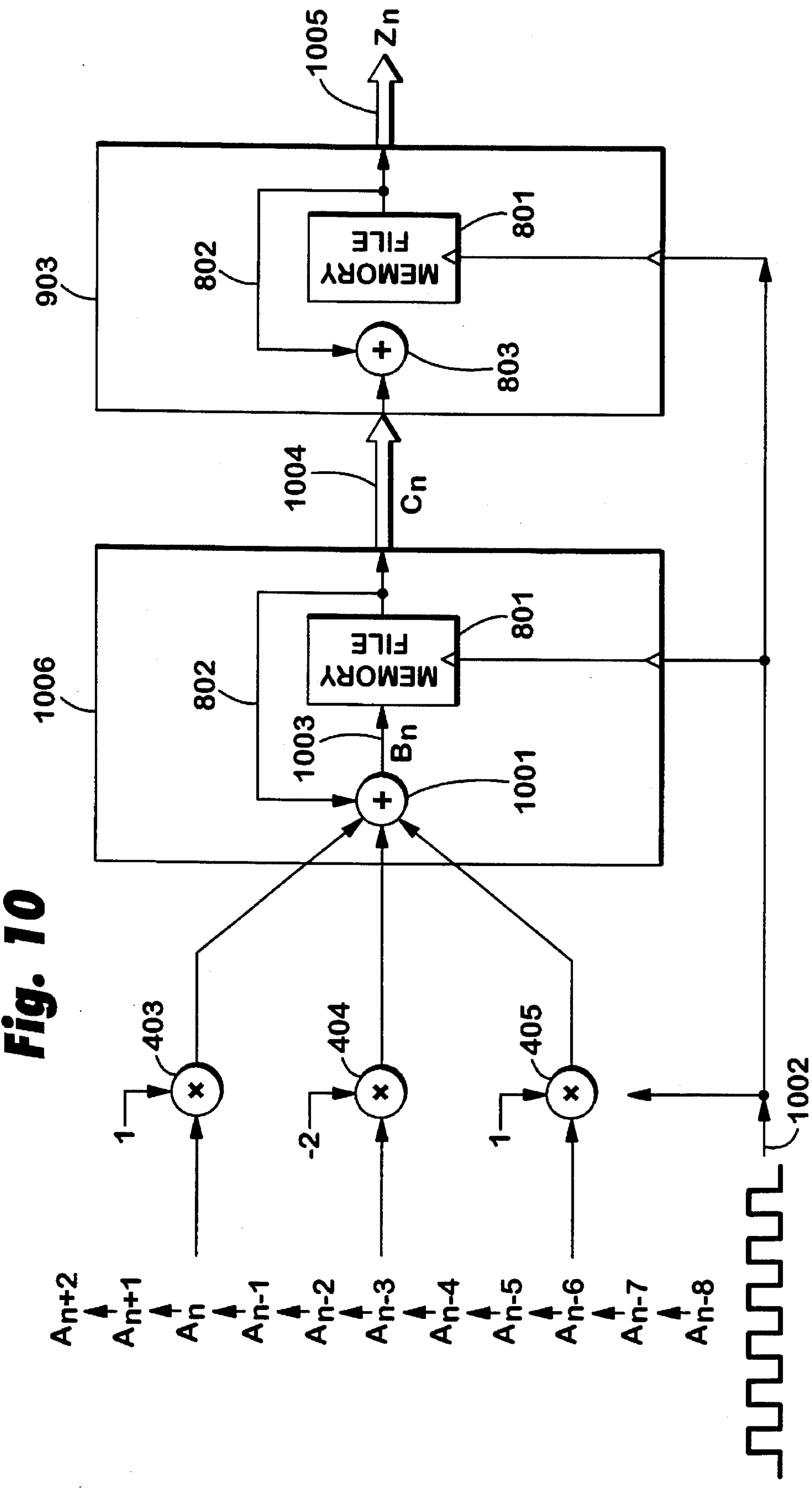
FIG. 10 is a diagram illustrating a full D-A circuit, in accordance with the present invention.

FIG. 10 shows a complete D-A circuit including three multipliers 403, 404 and 405, and a pair of accumulators 1006 and 903 arranged for performing the convolution of the functions discussed and illustrated in connection with FIGS. 1*a* and 2. A clock line 1002 is used to store and release data from the memory file 801 and to advance the input data to be convolved. The circuit of FIG. 10 can now perform the convolution of FIG. 1*a* and 2 with only three multiplies per convolution result ($Z_n$). The conventional method requires five multipliers. For longer convolver streams, the savings is greater.

As an example for a specific DSP application concerning a LASER radar, the clock line 1002 provides a clock at a rate of 83.3 MHz, with a D-A coefficient designated for the input function every 4 nanoseconds.

While three multipliers 403, 404 and 405 are shown, the multipliers 403 and 404 are unnecessary and can be bypassed because they are arranged to multiply by one. Moreover, a register performing a simple binary shift operation can replace the multiplier 404 because its function, multiplying by a factor of two, is effected by a single binary shift. Such circuitry reduction is common, expected and considered to be understood in the illustrated embodiments herein because, by their nature, D-A coefficients are generally small numbers.

Figure 6A:
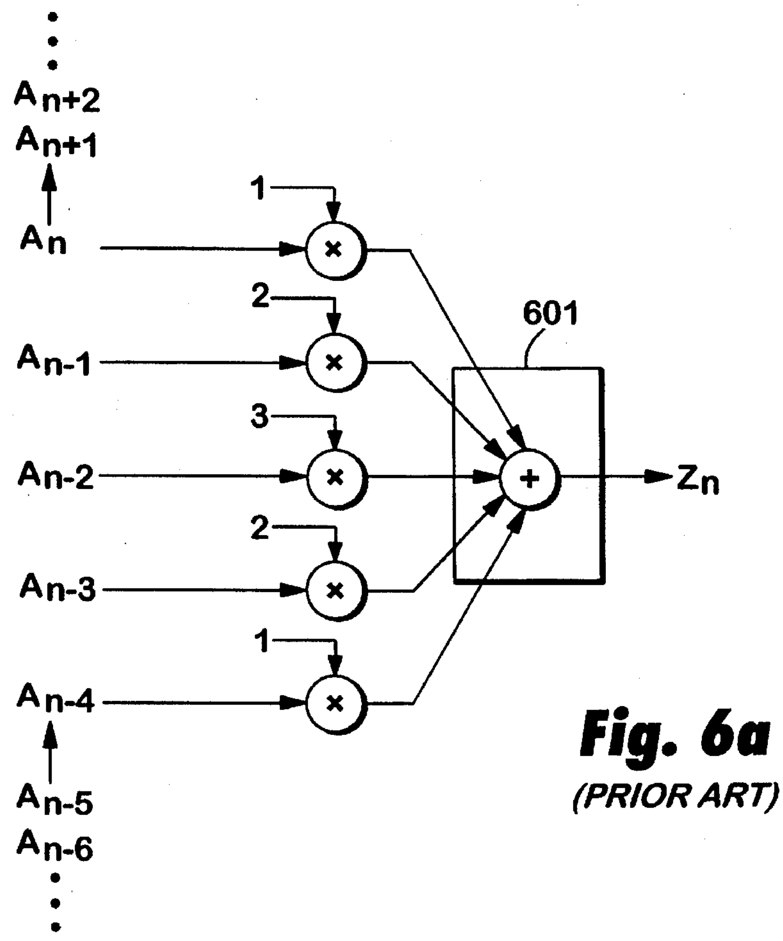
Figure 11A:
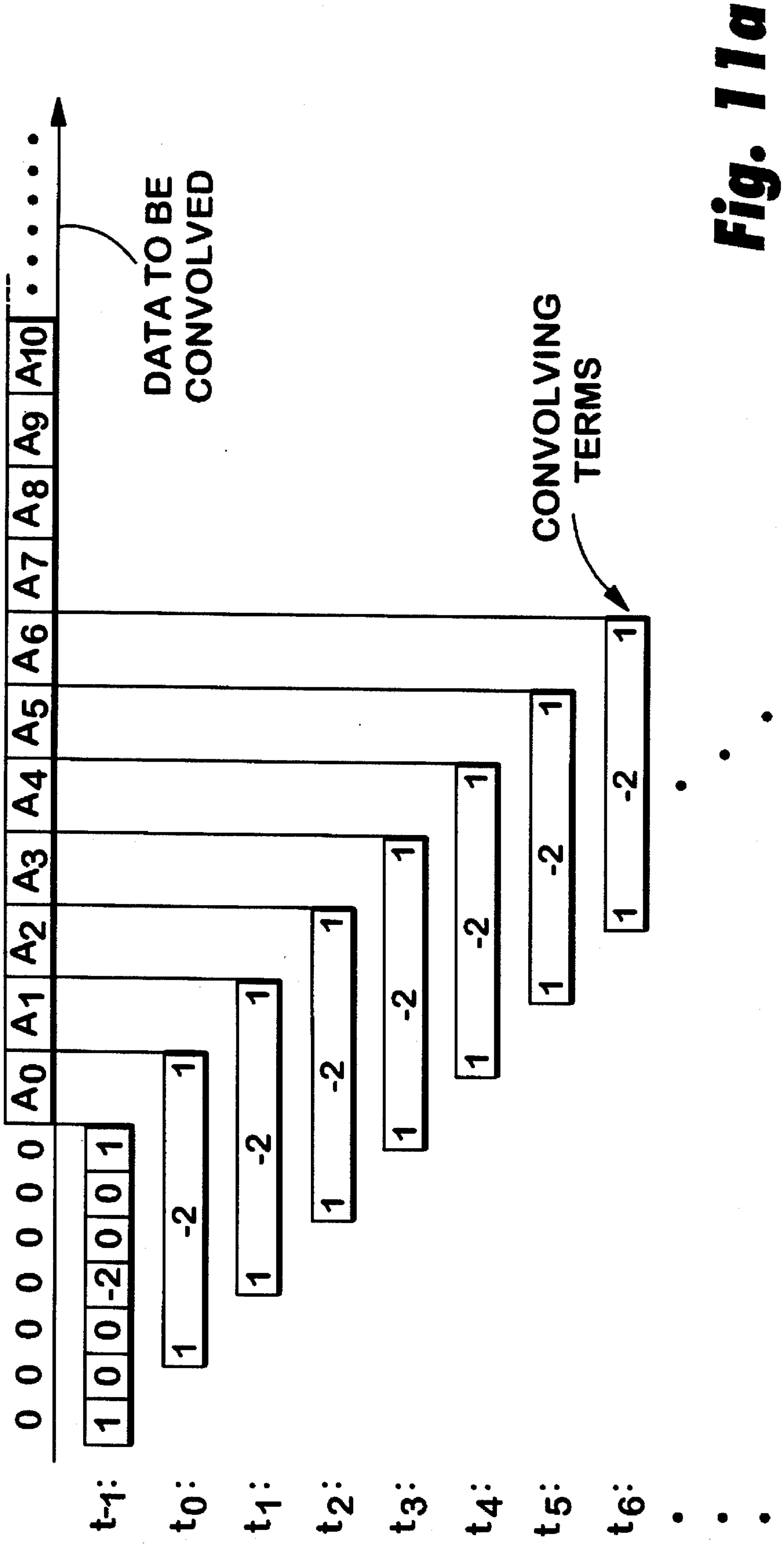
FIG. 11*a* is a table illustrating a process for performing the computations associated with the derivation of the D-A coefficients for the FCS of FIG. 1*a;*

FIGS. 11*a* and 11*b* illustrate the mathematics of these computations provided by the convolution result ($Z_n$) of FIG. 10. The data to be convolved is shown along the top horizontal axis of the table of FIG. 11(*a*), and the left vertical axis illustrates the convolving coefficients which are effectively slid across the data. At each sample time, the data values are read, multiplied by the D-A coefficients, summed, and double accumulated, as previously discussed. Note that the results are the same as the conventional implementation of FIG. 6(*b*).

Referring to FIG. 11(*a*), since most of the D-A coefficients are equal to zero and two of the coefficients are equal to one, far less multiplies are necessary.

In FIG. 11(*b*), a table shows the results of the convolution performed by the D-A circuit of FIG. 10. In FIGS. 10 and 11(*b*): "n" is the sample count; "$B_n$" 1003 is the output of summer 1001 for the sample count given by "n"; "$C_n$" is the output of the first accumulator 1006 for the sample count given by "n"; and "$Z_n$" is the convolution result at the time of the sample count "n".

Figure 12:
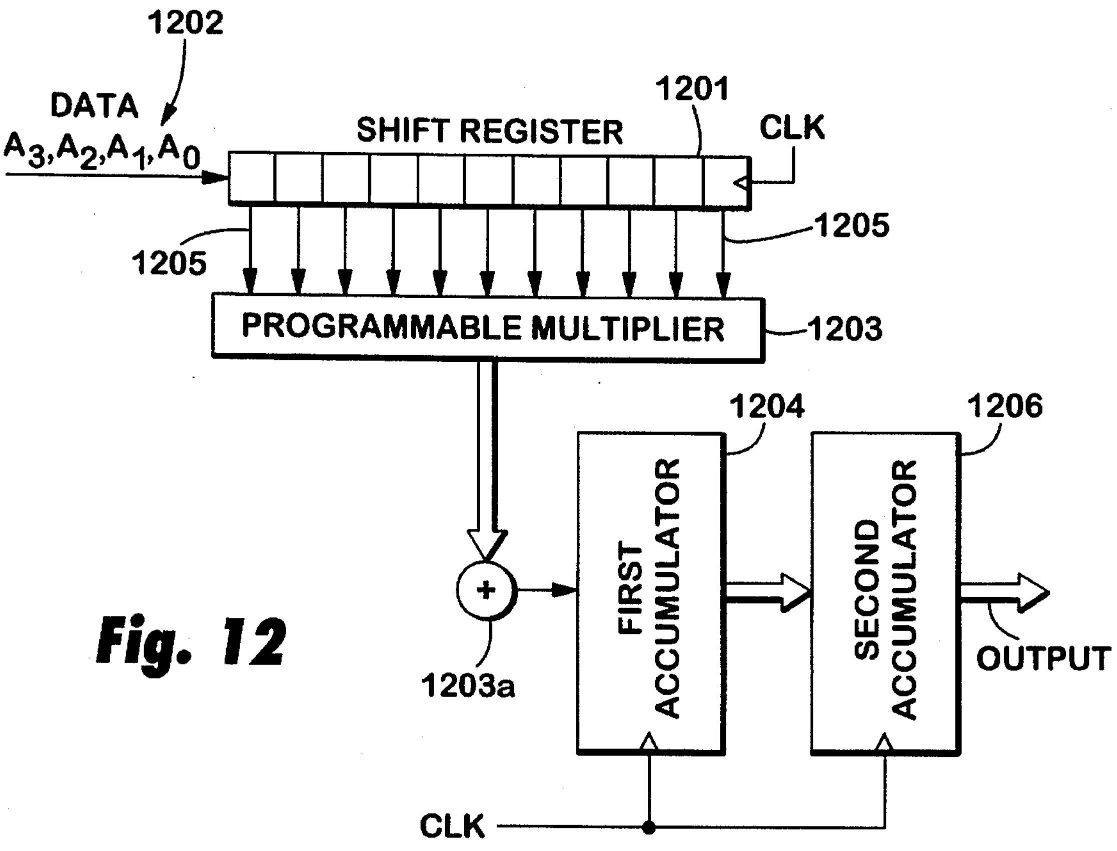
FIG. 12 is a diagram illustrating a software-programmable, shift-register implementation of a D-A convolving method provided by the present invention.

The present invention can be implemented using a variety of different circuits or software (including firmware) implementations. FIG. 12 shows a software programmable, shift register implementation of the D-A convolving method. Data samples 1202 are shifted into a shift register 1201. Each stage of the shift register 1201 has an output 1205 that enters a programmable multiplier 1203. The programmable multiplier 1203 selects which outputs 1205 to use and how to weight each of the selected outputs. Using the example of FIGS. 1*a* and 2, the multiplier 1203 uses only the first, third and sixth stages of the shift register 1201. Using the D-A coefficients from FIG. 2, the first stage is weighted by 1, the third stage is weighted by (−2), and the sixth stage is weighted by 1. The products from the multiplier 1203 are fed to a summer 1203a. The summer 1203a feeds the first accumulator 1204. The first accumulator 1204 feeds the second accumulator 1206. And finally, the result is output from the second accumulator 1206.

Figure 13:
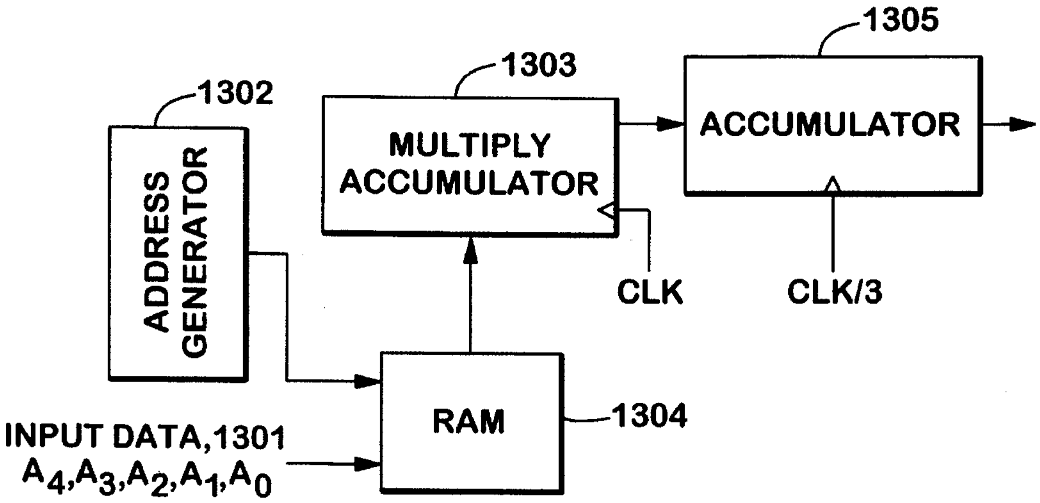
FIG. 13 is a diagram illustrating a D-A convolver implemented in a RAM-based circuit.

The invention is also useful in a RAM-based convolver. FIG. 13 shows a D-A convolver implemented in a hardware or software RAM-based circuit. RAM memory 1304 holds input data 1301 and D-A coefficients (1, (−2) and 1, from the example of FIG. 2). Each clock cycle, multiply-accumulator 1303 multiplies a single D-A coefficient by a single data sample. Address generator 1302 is responsible for sequencing the correct order of data samples and D-A coefficients into multiplier-accumulator 1303. The output of multiply-accumulator 1303 feeds accumulator 1305. The accumulator 1305 is clocked at a fraction of the system clock rate (in the case of the example from FIGS. 1 and 2, the accumulator clock is a third of the system clock). The fraction is equal to (1/(number of D-A coefficients)). This allows the accumulator 1305 to receive and sum, over 3 system clock cycles, the same three data points that accumulator 903 would receive and sum over a single clock cycle.

Accordingly, the present invention has been described using a number of DSP circuit implementations, each of which significantly reduces the number of multiply-and-accumulate operations which have been typically necessary per sample of input data. The reductions in multiply-and-accumulate operations is partially offset in the D-A method by the need for two accumulators. However, since accumulators are simpler to implement than multipliers, the elimination of one or two multipliers provides more than enough compensation. The specific embodiments shown, however, are not intended to limit the breadth and scope of the present invention. Those skilled in the art will recognize that various modifications and changes can be made to these embodiments. For example, many different types of processors, registers and memories, such as those enumerated previously, can be used for the accumulator element of the D-A circuit. Such changes do not depart from the spirit and scope of the invention as defined by the appended claims.

What is claimed is:

1. A circuit for convolving or correlating two functions comprising:

a plurality of multipliers each having an input and an output, each of said multipliers configured to multiply an input data sample by a non-zero coefficient, each of said coefficients being proportional to a derivative of at least one of said two functions;

a first accumulator having a plurality of inputs and an output, said first accumulator receiving the outputs of said multipliers; and a second accumulator receiving the output of said first accumulator.

2. The circuit of claim 1 wherein each of said coefficients is proportional to a second derivative of at least one of said two functions.

3. A circuit for convolving or correlating two functions comprising:

a multiply-accumulator for multiplying a coefficient by an input data sample, said multiply-accumulator having a plurality of inputs and an output, said coefficient being proportional to a derivative of at least one of said two functions;

a memory for holding said coefficient and input data samples, said memory having an input to receive said input data samples, an output for providing the coefficient and the input data samples to the multiply-accumulator, and an input to receive address information for determining what information to place on said output;

an address generator having an output for providing information to said memory; and an accumulator having an input for receiving the output of said multiply-accumulator and an output for providing a result.

4. The circuit of claim 3 wherein said coefficient is proportional to a second derivative of at least one of said two functions.

5. A method of correlating or convolving two functions using a first memory and a second memory, comprising the steps of:

multiplying a number of input data samples by an equal number of coefficients, said coefficients derived from a derivative of at least one of the two functions, to produce a number of products;

storing in said first memory the sum of said number of products and an output of said first memory; and storing in said second memory the sum of the output of said first memory and an output of said second memory.

6. The method of claim 5 wherein said coefficients are proportional to a second derivative of at least one of said two functions.

7. A circuit for convolving or correlating two functions comprising:

a plurality of multipliers each having an input and an output, each of said multipliers configured to multiply an input data sample by a coefficient, said coefficient derived from a derivative of at least one of the functions; and an accumulation circuit having a first accumulator including a first accumulating output and a second accumulator including a second accumulating output, the accumulation circuit adding the outputs of said multipliers with the first accumulating output to provide a summed output, and adding the summed output with the second accumulating output to provide a convolved or correlated output.

8. The circuit of claim 7 wherein said coefficients are proportional to a second derivative of at least one of said two functions.

9. The circuit of claim 7 wherein said first accumulator and said second accumulator are arranged in series.

* * * * *

UNITED STATES PATENT AND TRADEMARK OFFICE

CERTIFICATE OF CORRECTION

PATENT NO. : 5,511,015

DATED : April 23, 1996

INVENTOR(S) : Stuart W. Flockencier

It is certified that error appears in the above-indentified patent and that said Letters Patent is hereby corrected as shown below:

Column 3, line 5, "$A_1$" should be --$A_t$--.

Column 7, line 35, "$A_{n-1}$" should be --$A_{n-t}$--.

Column 7, line 45 "$A_{n-1}$" should be --$A_{n-t}$--.

Signed and Sealed this

Eighth Day of October, 1996

Attest:

BRUCE LEHMAN

*Attesting Officer*

*Commissioner of Patents and Trademarks*